United States Patent
Koyama et al.

(10) Patent No.: US 7,355,457 B2
(45) Date of Patent: Apr. 8, 2008

(54) FREQUENCY SYNTHESIZER

(75) Inventors: Yoshito Koyama, Kawasaki (JP); Koji Nakamuta, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 584 days.

(21) Appl. No.: 11/086,237

(22) Filed: Mar. 22, 2005

(65) Prior Publication Data

US 2005/0162197 A1    Jul. 28, 2005

Related U.S. Application Data

(63) Continuation of application No. PCT/JP03/010932, filed on Aug. 28, 2003.

(30) Foreign Application Priority Data

Nov. 19, 2002 (WO) .................. PCT/JP02/12052

(51) Int. Cl.
G01R 25/00   (2006.01)
H03D 13/00   (2006.01)

(52) U.S. Cl. .................................... 327/105
(58) Field of Classification Search .............. None
See application file for complete search history.

(56) References Cited

U.S. PATENT DOCUMENTS

| | | | |
|---|---|---|---|
| 6,356,112 B1 * | 3/2002 | Tran et al. | 326/52 |
| 2002/0114386 A1 * | 8/2002 | Eklof | 375/238 |
| 2004/0207436 A1 * | 10/2004 | Suda et al. | 327/105 |

FOREIGN PATENT DOCUMENTS

| | | |
|---|---|---|
| JP | 6-209216 | 7/1994 |
| JP | 9-270706 | 10/1997 |
| JP | 10-041816 | 2/1998 |

* cited by examiner

*Primary Examiner*—Lincoln Donovan
*Assistant Examiner*—Erick Glass
(74) *Attorney, Agent, or Firm*—Katten Muchin Rosenman LLP

(57) ABSTRACT

The invention relates to a frequency synthesizer. An object of the invention is to provide a frequency synthesizer whose high stable performance is realized at an inexpensive cost. The frequency synthesizer includes a frequency synthesizing section generating an output signal by performing indirect frequency synthesis at a period which is equal to a product of a period of the reference signal and a first integer, and a clock generating section generating the clock signal by performing frequency synthesis for the output signal and for maintaining a frequency of the clock signal at a value which is equal to a difference between or a sum of a first frequency which is equal to a product of the frequency of the reference signal and a second integer and a second frequency indicating a number of times the phase difference is compressed.

19 Claims, 11 Drawing Sheets

FREQUENCY SYNTHESIZER

CROSS REFERENCE TO RELATED APPLICATION

This application is a continuation application of International Application PCT/JP 03/10932, filed Aug. 28, 2003 and claims the benefit of priority from International Application PCT/JP02/12052, filed Nov. 19, 2002, and designating the U.S., the contents of which are incorporated herein.

BACKGROUND OF THE INVENTION

1. Field of the Invention

The present invention relates to a frequency synthesizer for generating signals having desired frequencies in synchronization with a reference signal having a reference frequency.

2. Description of the Related Art

A phase locked loop (PLL) to which highly advanced electronic circuit techniques and digital signal processing techniques are applied is being widely used for not only household electric appliances but also trunk line communication networks and communication apparatuses where synchronization among signals must be stably maintained with high precision. This is because the PLL can be stably and synergistically implemented with the following advantages.

- To be easily and flexibly adapted to a very wide range of frequency bands in a digital domain.
- To be flexibly adapted to variations and inequalities of temperature, operation voltages and other environmental conditions.
- To make adjustments easy.
- To stably achieve and maintain desired performance even when the precision of components is not substantially high.

FIG. 10 is a diagram illustrating a first configuration example of a frequency synthesizer having a phase locked loop.

As shown in the figure, a reference signal having a reference frequency fr (herein assumed to be 8 KHz) is stationarily inputted to one input terminal of a digital phase detector (DPD) 41 whose output terminal is connected to an input terminal of a voltage controlled oscillator (VCO) 43 via a digital signal processor (DSP) 42. An output signal having a desired frequency F (herein assumed to be 3.24 MHz) is obtained from an output terminal of the voltage controlled oscillator 43 and is inputted to input terminals of a pre-scaler 44 and a clock signal generator 45. An output terminal of the pre-scaler 44 is connected to the other input terminal of the digital phase detector 41 and an output terminal of the clock signal generator 45 is connected to a clock terminal of the digital phase detector 41.

In the frequency synthesizer as configured above, the clock signal generator 45 multiplies an output signal outputted from the voltage controlled oscillator 43 by a predefined multiplication ratio m ($=24=77.76 \times 10^6/(3.24 \times 10^6)$) to thereby generate a clock signal having a predefined frequency fc (herein assumed to be 77.76 MHz).

In addition, a pre-scaler 44 divides an output signal outputted from the voltage controlled oscillator 43 by a predefined division ratio d ($=405=3.24 \times 10^6/(8 \times 10^3)$) to thereby generate a feedback signal.

A digital phase detector 41 detects a phase difference $\Delta\theta$ between the reference signal and the feedback signal at a point of a leading edge (or a trailing edge) of the clock signal.

A digital signal processor 42 integrates a series of phase differences $\Delta\theta$ detected as described above every time $\tau$ ($=4$ ms$=1/(8\times10^3)\times32$) that is 32 times a period ($=1/\text{fr}$) of a reference signal, removes undesired harmonic components included in a result of the integration, and accordingly, maintains an instantaneous voltage value Vc of a control signal, which is to be provided to the voltage controlled oscillator 43, at a value where a phase difference $\Delta\theta$ of the control signal is compressed.

Accordingly, as long as a frequency fr of a reference signal is precisely maintained at a desired value and a proper division ratio d and a multiplication ratio m are set in the pre-scaler 44 and the clock signal generator 45, respectively, a frequency F of an output signal generated from the voltage controlled oscillator 43 can be maintained at a desired frequency F ($=3.24$ MHz) precisely and stably.

FIG. 11 is a diagram illustrating a second configuration example of a frequency synthesizer having a phase locked loop.

The configuration of the frequency synthesizer shown in FIG. 11 is different from that of the frequency synthesizer shown in FIG. 10 (hereinafter referred to as first conventional example) in the following respects.

- A digital signal processor 42 and a clock signal generator 45 are replaced with a digital signal processor (DSP) 42A and a clock signal generator 45A, respectively.
- A local reference signal oscillator (OSC) 51 is added.
- An output terminal of the local reference signal oscillator (OSC) 51, in stead of the output terminal of the voltage controlled oscillator 43, is connected to an input terminal of the clock signal generator 45A.
- The voltage controlled oscillator 43 is replaced with a direct frequency synthesizer (DDS) 53 having two input terminals connected respectively to an output terminal of the digital signal processor 42A and the output terminal of the local reference signal oscillator 51 and a low pass filter (LPF) 52 cascaded at a subsequent stage.

In the frequency synthesizer as configured above (hereinafter referred to as second conventional example), the clock signal generator 45A divides a frequency of a local reference signal (herein assumed that the frequency is $f_L$) generated from the local reference signal oscillator 51 by a division ratio d' suitable for a frequency of the local reference signal to thereby generate a clock signal having the frequency fc as mentioned above.

In addition, the digital signal processor 42A provides a instantaneous value Vc of the control signal as mentioned above to the direct frequency synthesizer (DDS) 53, as a series of values adapted to characteristics of the direct frequency synthesizer 53 and at which a frequency F of the output signal generated from the direct frequency synthesizer 53 and the low pass filter 52 is maintained at desired values.

Accordingly, a frequency of an output signal is precisely and stably maintained at a desired value F in the same manner as in the first conventional example.

However, in the first conventional example, for example, improvement of the precision and stability of the frequency F of the output signal can be achieved only when the precision of the phase difference $\Delta\theta$ detected by the digital phase detector 41 is sufficiently high. To this end, the frequency fc of the clock signal provided to the digital phase detector 41 must be set to a high value.

However, in order to set the frequency fc of the clock signal to a high value, the clock signal generators 45 and 45A must employ devices or circuits which can operate at such a high frequency that the frequency fc can be sufficiently achieved.

Accordingly, actually, it is substantially difficult to improve a precision of a frequency of an output signal under restriction on costs, power consumption, thermal design and other factors.

In addition, in the first conventional example, a clock signal is generated by dividing (or multiplying) a frequency of an output signal directly, as described above. Accordingly, for example, if a frequency fr of a reference signal is inadequately shifted or varied, a clock signal is maintained at a frequency in proportion to the improper frequency.

Accordingly, it is difficult to determine regularity of the frequency fr of a reference signal unless a separate monitoring section is added.

SUMMARY OF THE INVENTION

Accordingly, it is an object of the invention to provide a frequency synthesizer whose configuration is less complicated and whose performance is realized at an inexpensive cost and is stably maintained.

It is another object of the invention to enhance precision of indirect frequency synthesis even when a frequency of a clock signal is not set to a large value in a large margin.

In the description, indirect frequency synthesis refers to frequency synthesis where a frequency of an output signal is indirectly set to a desired frequency using a phase locked loop for minimizing a phase difference between a reference signal and an output signal. On the other hand, direct frequency synthesis refers to frequency synthesis where a desired frequency is obtained as sum, difference, multiplication, and quotient of frequencies by performing a process including a combination of multiplication, division, frequency conversion and filtering, on a signal having a reference frequency.

It is yet another object of the invention to maintain a frequency of an output signal at a desired value stably and precisely.

It is yet another object of the invention to provide flexible adaptation for devices or systems having various functions, configurations, specifications and so on.

It is yet another object of the invention to maintain phase synchronization of a reference signal inexpensively and stably in a process of indirect frequency synthesis.

It is yet another object of the invention to provide flexible adaptation for configuration of a feedback path and maintain a normal response of a phase locked loop stably.

It is yet another object of the invention to improve and stably maintain response of a frequency synthesizer and a distortion ratio of an output signal of the frequency synthesizer.

It is yet another object of the invention to provide adaptation to various configurations and characteristics of a frequency synthesizing section and adaptation of the invention to various systems and devices.

It is yet another object of the invention to generate an output signal stably and precisely in a process of indirect frequency synthesis using a phase locked loop.

It is yet another object of the invention to enhance performance of systems and devices to which the invention is applied and maintain high reliability of the systems and devices without complexity of configuration and an increase of production costs of the systems and devices.

To achieve the above objects, according to an aspect of the invention, there is provided a frequency synthesizer, wherein indirect frequency synthesis is performed in which a phase difference between a reference signal having a reference frequency and an output signal is compressed in synchronization with a clock signal at a period which is equal to a product of a period of the reference signal and a first integer, the clock signal is generated by performing frequency synthesis for the output signal generated as a result of the indirect frequency synthesis, and a frequency of the clock signal is maintained at a value which is equal to a difference between or a sum of a first frequency which is equal to a product of the frequency of the reference signal and a second integer and a second frequency indicating a number of times the phase difference is compressed.

In the frequency synthesizer according to the above aspect of the invention, a point of time when the phase of the reference signal is compared to the phase of the output signal is not a point of time when the phase of output signal with respect to the phase of the reference signal is constant, but a plurality of points of time repeatedly circulated at a period which is equal to a product of the frequency of the reference signal and the first integer.

To achieve the above objects, according to another aspect of the invention, there is provided a frequency synthesizer, which is different from the frequency synthesizer according to the above aspect of the invention in that the clock signal is generated by frequency synthesis performed for a standard signal which locally provides a reference of a frequency applied for the indirect frequency synthesis.

In the frequency synthesizer according to the above aspect of the invention, a point of time when the phase of the reference signal is compared to the phase of the output signal is not a point of time when the phase of output signal with respect to the phase of the reference signal is constant, but a plurality of points of time repeatedly circulated at a period which is equal to a product of the frequency of the reference signal and the first integer.

To achieve the above objects, according to another of the invention, there is provided a frequency synthesizer, wherein a frequency deviation of a reference signal is compared to a threshold value which is less than a second frequency indicating a number of times a phase difference between the reference signal and an output signal is compressed, and a clock signal is generated by performing frequency synthesis for the output signal when the frequency deviation of the reference signal is less than the threshold value and by performing frequency synthesis for a standard signal which locally provides a reference of a frequency applied for indirect frequency synthesis when the frequency deviation of the reference signal exceeds the threshold value.

In the frequency synthesizer according to the above aspect of the invention, even when the frequency of the reference signal is varied or shifted by a large margin, the phase difference between the reference signal and the output signal is compared in a state of higher resolution than a conversion value of a period of the clock signal in a process of the indirect frequency synthesis.

To achieve the above objects, according to still another aspect of the invention, there is provided a frequency synthesizer, wherein a clock signal is generated by performing frequency synthesis for an output signal when a synthesis ratio of indirect frequency synthesis is in a range where a frequency deviation of a reference signal exceeds a predetermined value which is less than a second frequency indicating a number of times a phase difference between the reference signal and the output signal is compressed and by performing frequency synthesis for a standard signal which locally provides a reference of a frequency applied for the indirect frequency synthesis when the synthesis ratio is not in the range.

In the frequency synthesizer according to the above aspect of the invention, even when the frequency of the reference signal is varied or shifted by a large margin, the phase difference between the reference signal and the output signal is compared in a state of higher resolution than a conversion value of a period of the clock signal in a process of the indirect frequency synthesis.

To achieve the above objects, according to still another aspect of the invention, there is provided a frequency synthesizer, wherein a frequency deviation of a reference signal is transmitted to an apparatus for selecting either an output signal or a standard signal which locally provides a reference of a frequency applied for indirect frequency synthesis, and a clock signal is generated by performing frequency synthesis for the output signal or for the standard signal selected by the apparatus.

In the frequency synthesizer according to the above aspect of the invention, the frequency of the clock signal is maintained at a value which is equal to not only the frequency deviation of the reference signal but also the aforementioned difference or sum in a form adapted to a process performed by the apparatus.

To achieve the above objects, according to still another aspect of the invention, there is provided a frequency synthesizer, wherein a synthesis ratio of indirect frequency synthesis for generating an output signal is transmitted to an apparatus for selecting one of the output signal and a standard signal which locally provides a reference of a frequency applied for indirect frequency synthesis based on the synthesis ratio, and a clock signal is generated by performing frequency synthesis for the output signal or for the standard signal selected by the apparatus.

In the frequency synthesizer according to the above aspect of the invention, the frequency of the clock signal is maintained at a value which is equal to not only a frequency deviation of the reference signal but also the aforementioned difference or sum in a form adapted to a process performed by the apparatus.

To achieve the above objects, according to still another aspect of the invention, there is provided a frequency synthesizer, wherein a frequency of a clock signal is maintained at a frequency obtained when a frequency not deviated from a frequency of a reference signal is applied as a second frequency.

In the frequency synthesizer according to the above aspect of the invention, the frequency of the clock signal is maintained at a very appropriate value without changing its basic configuration even when a frequency of an output signal involves deviation, or is varied or shifted.

To achieve the above objects, according to still another aspect of the invention, there is provided a frequency synthesizer, wherein a frequency of a clock signal is maintained at a frequency obtained when a frequency not deviated from a frequency of an output signal is applied as a second frequency.

In the frequency synthesizer according to the above aspect of the invention, the frequency of the clock signal is maintained at a very appropriate value without changing its basic configuration even when the frequency of the output signal involves deviation, or is varied or shifted.

To achieve the above objects, according to still another aspect of the invention, there is provided a frequency synthesizer, wherein, before indirect frequency synthesis for generating an output signal is performed, frequency components which correspond to both a sum of a nominal frequency of a reference signal and a second frequency and a difference between the nominal frequency of the reference signal and the second frequency or either the sum or the difference of the same, among frequency components of the reference signal, are suppressed.

In the frequency synthesizer according to the above aspect of the invention, an abnormal response of a phase locked loop caused by the fact that lower frequency components or higher frequency components within a range from the frequency of the reference signal to the above-mentioned second frequency are included in the reference signal can be avoided.

To achieve the above objects, according to still another aspect of the invention, there is provided a frequency synthesizer, wherein specific frequency components, which correspond to both a sum of a frequency standard value of the feedback signal whose phase is compared to a phase of the reference signal and the second frequency and a difference between the frequency standard value of the feedback signal and the second frequency or either the sum or the difference of the same, among frequency components of the output signal, are suppressed in a feedback path for implementing the indirect frequency synthesis.

In the frequency synthesizer according to the above aspect of the invention, an abnormal response of a phase locked loop caused by the fact that lower frequency components or higher frequency components within a range from the frequency standard value of the feedback signal to the second frequency are included in the feedback signal can be avoided.

To achieve the above objects, according to still another aspect of the invention, there is provided a frequency synthesizer, wherein specific frequency components are suppressed in a process of converting an output signal into a feedback signal.

In the frequency synthesizer according to the above aspect of the invention, frequency components, which are included in the feedback signal and are lower or higher within a range from the frequency standard value of the feedback signal to the second frequency, is suppressed in a frequency band different from a frequency occupation band of the feedback signal in the feedback path.

To achieve the above objects, according to still another aspect of the invention, there is provided a frequency synthesizer, wherein a first frequency is a common multiple of a frequency of a reference signal and a nominal frequency of an output signal.

In the frequency synthesizer according to the above aspect of the invention, a phase of a feedback signal, which is compared to a phase of the reference signal in a phase locked loop, can be cyclically obtained as a series of the same phases at a period which is equal to a product of a period of the reference signal and a first integer.

To achieve the above objects, according to still another aspect of the invention, there is provided a frequency synthesizer, wherein a second frequency indicating a number of times a phase difference between a reference signal and an output signal is compressed is an integral multiple of a frequency of the reference signal.

In the frequency synthesizer according to the above aspect of the invention, a phase of a feedback signal, which is compared to a phase of the reference signal in a phase locked loop, can be cyclically obtained as a series of phases at a period which is equal to a product of a period of the reference signal and a first integer.

To achieve the above objects, according to still another aspect of the invention, there is provided a frequency synthesizer, wherein a first integer is set to a large value so that deterioration of precision of indirect frequency synthesis is allowable.

In the frequency synthesizer according to the above aspect of the invention, the indirect frequency synthesis for generating an output signal is flexibly implemented in various forms even when a frequency of a reference signal is set to a large value.

To achieve the above objects, according to still another aspect of the invention, there is provided a frequency synthesizer, wherein a second integer is set to a small value so that deterioration of precision of indirect frequency synthesis is allowable.

In the frequency synthesizer according to the above aspect of the invention, a frequency of a clock signal whose period to be obtained in a phase locked loop is indicated by a phase difference between a reference signal and a feedback signal is set to a desired large value even when a frequency of the reference signal is set to a large value.

To achieve the above objects, according to still another aspect of the invention, there is provided a frequency synthesizer, wherein a clock signal is generated based on indirect frequency synthesis for monitoring and correcting a phase deviation as compared to a standard signal or a phase deviation as compared to a standard signal selected by a selection section in a band of a frequency higher than a second frequency.

In the frequency synthesizer according to the above aspect of the invention, a division ratio to be applied for frequency divisions of the standard signal and the clock signal in order to compare a phase of the standard signal with a phase of the clock signal in the band of the frequency higher than the second frequency is set to a small value, as compared to a case where the phase comparison is performed in a frequency band including the second frequency.

BRIEF DESCRIPTION OF THE DRAWINGS

The nature, principle, and utility of the invention will become more apparent from the following detailed description when read in conjunction with the accompanying drawings in which like parts are designated by identical reference numbers, in which.

DESCRIPTION OF PREFERRED EMBODIMENTS

To begin with, principles of a frequency synthesizer according to the invention will be described in reference to FIGS. 1 to 6.

Figure 1:
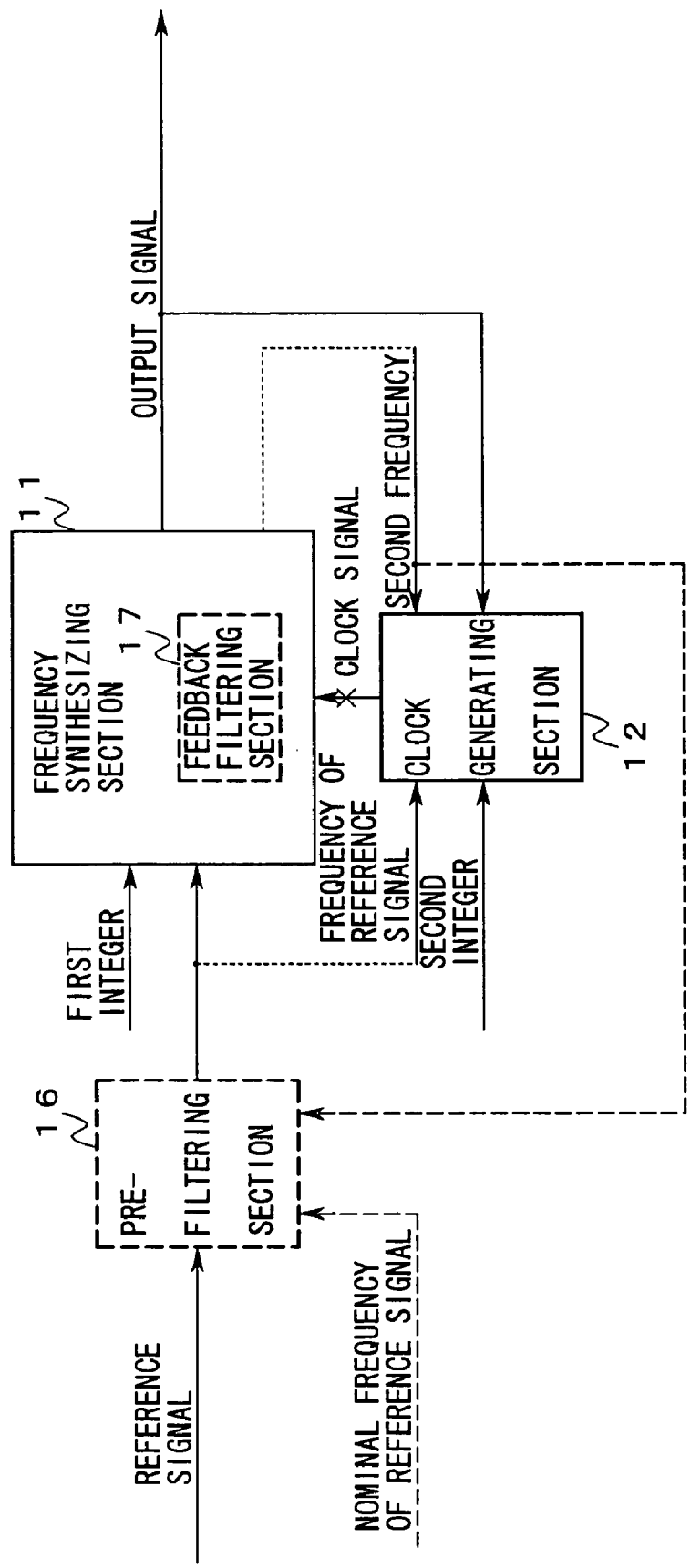
FIG. 1 is a block diagram illustrating a first principle of a frequency synthesizer according to the invention.

FIG. 1 is a block diagram illustrating a first principle of a frequency synthesizer according to the invention.

The frequency synthesizer shown in FIG. 1 includes a frequency synthesizing section 11, a clock generating section 12, a pre-filtering section 16, and a feedback filtering section 17.

The first principle of the frequency synthesizer according to the invention is as 10 follows.

The frequency synthesizing section 11 generate an output signal by performing indirect frequency synthesis in which a phase difference between a reference signal having a reference frequency and the output signal is compressed in synchronization with a clock signal at a period which is equal to a product of a period of the reference signal and a first 15 integer. The clock generating section 12 generates the clock signal by performing frequency synthesis for the output signal and maintains a frequency of the clock signal at a value which is equal to a difference between or a sum of a first frequency which is equal to a product of the frequency of the reference signal and a second integer and a second frequency indicating a number of times the phase difference is compressed by the frequency synthesizing section 11.

In the frequency synthesizer as configured above, since phase synchronization is made for the reference signal, a point of time when the phase of the reference signal is compared to the phase of the output signal by the frequency synthesizing section 11 is not a point of time when the phase of output signal with respect to the phase of the reference signal is constant, but a plurality of points of time repeatedly circulated at a period which is equal to a product of the frequency of the reference signal and the first integer.

Accordingly, even when the frequency of the clock signal is not set to a large value by a large margin, precision of the indirect frequency synthesis performed by the frequency synthesizing section 11 can be enhanced.

Figure 2:
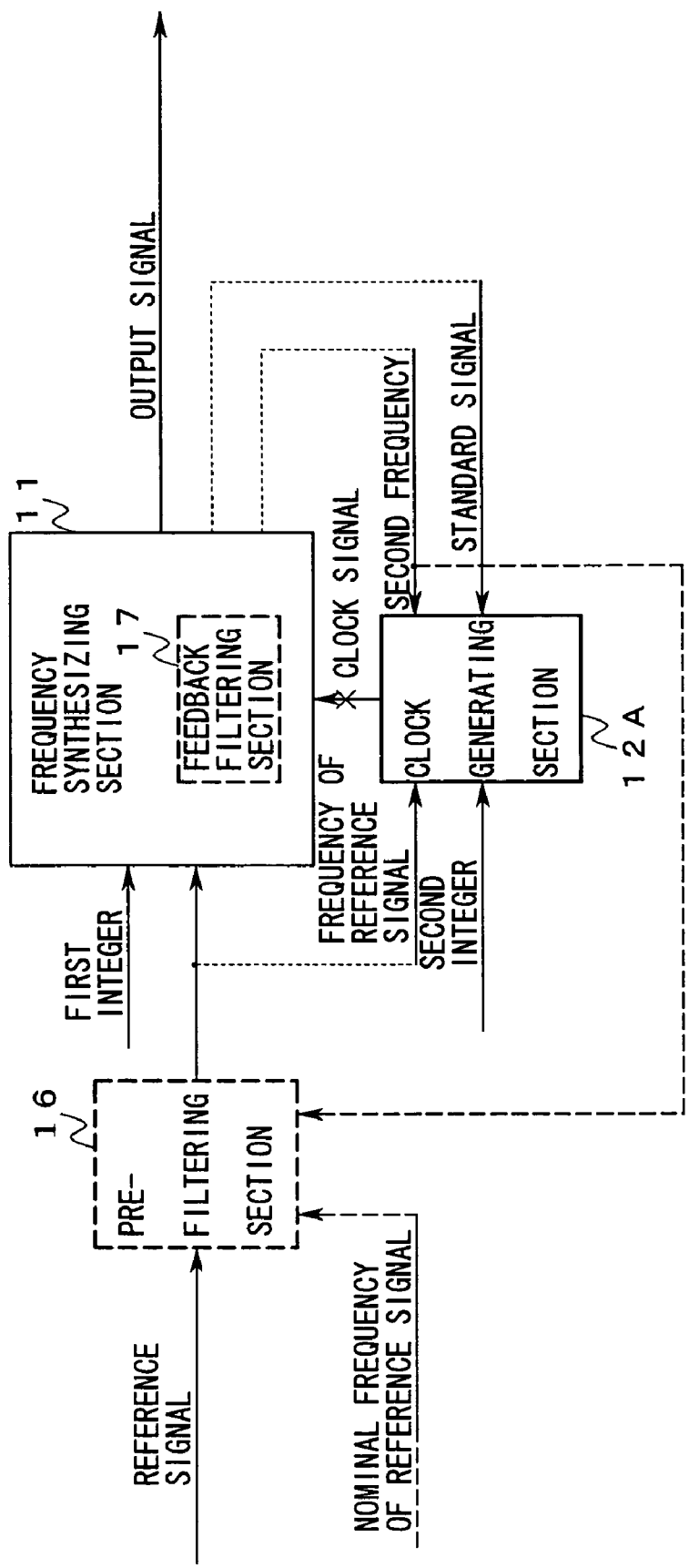
FIG. 2 is a block diagram illustrating a second principle of a frequency synthesizer according to the invention.

FIG. 2 is a block diagram illustrating a second principle of a frequency synthesizer according to the invention.

The frequency synthesizer shown in FIG. 2 includes a frequency synthesizing section 11, a clock generating section 12A, a pre-filtering section 16, and a feedback filtering section 17.

The second principle of the frequency synthesizer according to the invention is as follows.

The frequency synthesizing section 11 generate an output signal by performing indirect frequency synthesis in which a phase difference between a reference signal having a reference frequency and the output signal is compressed in synchronization with a clock signal at a period which is equal to a product of a period of the reference signal and a first integer. The clock generating section 12A generates the clock signal by performing frequency synthesis for a standard signal which locally provides a reference of a frequency applied for the indirect frequency synthesis and maintains a frequency of the clock signal at a value which is equal to a difference between or a sum of a first frequency which is equal to a product of the frequency of the reference signal and a second integer and a second frequency indicating a number of times the phase difference is compressed by the frequency synthesizing section 11.

In the frequency synthesizer as configured above, since phase synchronization is made for the reference signal, a point of time when the phase of the reference signal is compared to the phase of the output signal by the frequency synthesizing section 11 is not a point of time when the phase of output signal with respect to the phase of the reference signal is constant, but a plurality of points of time repeatedly circulated at a period which is equal to a product of the frequency of the reference signal and the first integer.

Accordingly, even when the frequency of the clock signal is not set to a large value by a large margin, precision of the indirect frequency synthesis performed by the frequency synthesizing section 11 can be enhanced.

Figure 3:
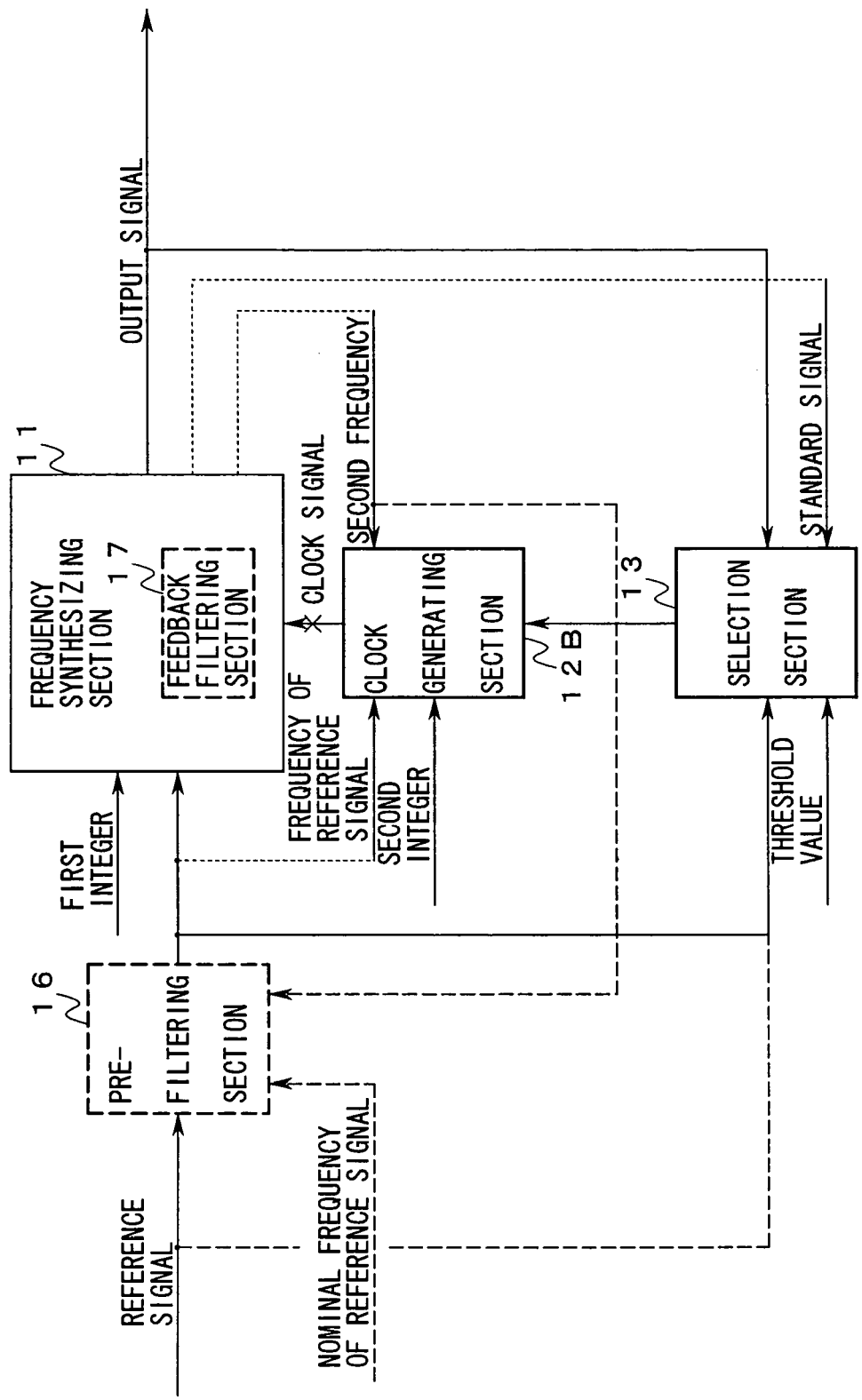
FIG. 3 is a block diagram illustrating a third principle of a frequency synthesizer according to the invention.

FIG. 3 is a block diagram illustrating a third principle of a frequency synthesizer according to the invention.

The frequency synthesizer shown in FIG. 3 includes a frequency synthesizing section 11, a selection section 13, a clock generating section 12B, a pre-filtering section 16, and a feedback filtering section 17.

The third principle of the frequency synthesizer according to the invention is as follows.

The frequency synthesizing section 11 generate an output signal by performing indirect frequency synthesis in which a phase difference between a reference signal having a reference frequency and the output signal is compressed in synchronization with a clock signal at a period which is equal to a product of a period of the reference signal and a first integer. The selection section 13 compares a frequency deviation of the reference signal with a threshold value which is less than a second frequency indicating a number of times the phase difference between the reference signal and the output signal is compressed, selects the output signal when the frequency deviation of the reference signal is less than the threshold value, and selects a standard signal which locally provides a reference of a frequency applied for indirect frequency synthesis when the frequency deviation of the reference signal exceeds the threshold value. The clock generating section 12B generates the clock signal by performing frequency synthesis for the output signal or for the standard signal selected by the selection section 13 and maintains a frequency of the clock signal at a value which is equal to a difference between or a sum of a first frequency which is equal to a product of the frequency of the reference signal and a second integer and a second frequency indicating a number of times the phase difference is compressed by the frequency synthesizing section 11.

In this frequency synthesizer, even when the frequency of the reference signal is varied or shifted by a large margin, the phase difference between the reference signal and the output signal is compared in a state of higher resolution than a conversion value of a period of the clock signal in a process of the indirect frequency synthesis performed by the frequency synthesizing section 11.

Accordingly, the frequency of the output signal is maintained at a desired value stably and precisely.

Figure 4:
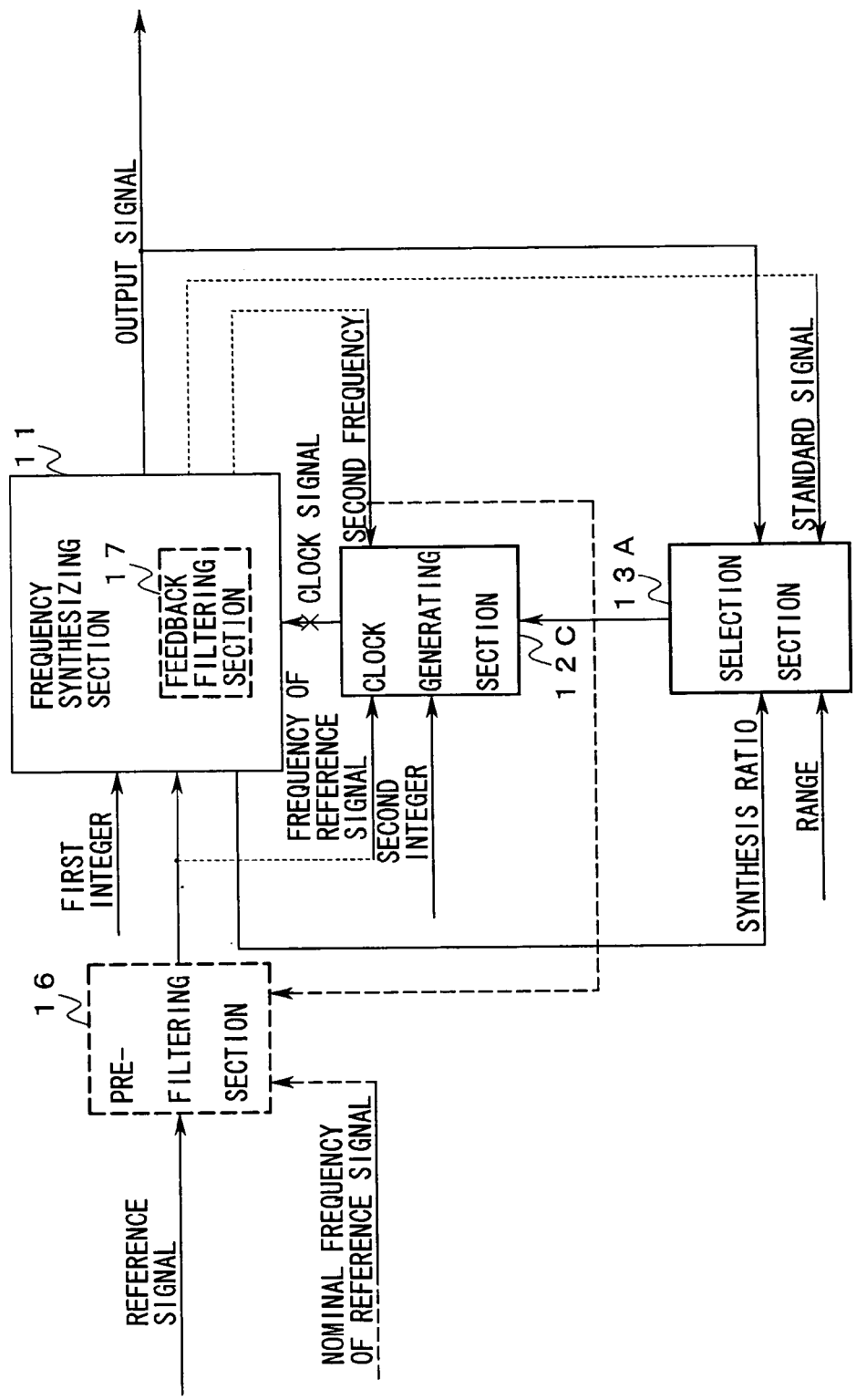
FIG. 4 is a block diagram illustrating a fourth principle of a frequency synthesizer according to the invention.

FIG. 4 is a block diagram illustrating a fourth principle of a frequency synthesizer according to the invention.

The frequency synthesizer shown in FIG. 4 includes a frequency synthesizing section 11, a clock generating section 12C, a selection section 13A, a pre-filtering section 16, and a feedback filtering section 17.

The fourth principle of the frequency synthesizer according to the invention is as follows.

The frequency synthesizing section 11 generate an output signal by performing indirect frequency synthesis in which a phase difference between a reference signal having a reference frequency and the output signal is compressed in synchronization with a clock signal at a period which is equal to a product of a period of the reference signal and a first integer. The selection section 13A selects the output signal if a synthesis ratio of the indirect frequency synthesis is in a range where a frequency deviation of a reference signal exceeds a predetermined value which is less than a second frequency indicating a number of times a phase difference between the reference signal and the output signal is compressed and selects a standard signal which locally provides a reference of a frequency applied for the indirect frequency synthesis if the synthesis ratio is not in the range. The clock generating section 12C generates the clock signal by performing frequency synthesis for the output signal or for the standard signal selected by the selection section 13A and maintains a frequency of the clock signal at a value which is equal to a difference between or a sum of a first frequency which is equal to a product of the frequency of the reference signal and a second integer and a second frequency indicating a number of times the phase difference is compressed by the frequency synthesizing section 11.

In this frequency synthesizer, even when the frequency of the reference signal is varied or shifted by a large margin, the phase difference between the reference signal and the output signal is compared in a state of higher resolution than a conversion value of a period of the clock signal in a process of the indirect frequency synthesis performed by the frequency synthesizing section 11.

Accordingly, the frequency of the output signal can be maintained at a desired value stably and precisely.

Figure 5:
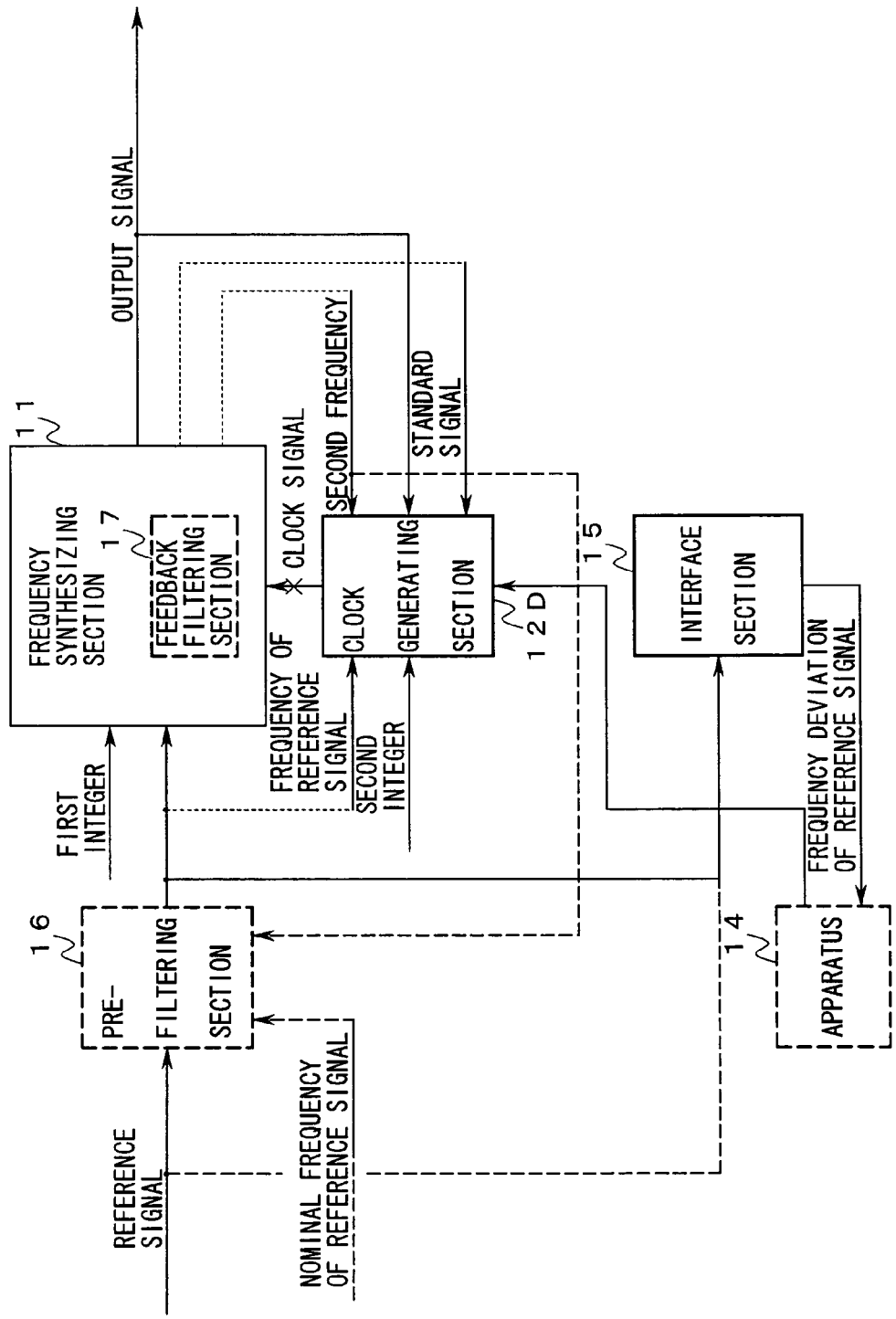
FIG. 5 is a block diagram illustrating a fifth principle of a frequency synthesizer according to the invention.

FIG. 5 is a block diagram illustrating a fifth principle of a frequency synthesizer according to the invention.

The frequency synthesizer shown in FIG. 5 includes a frequency synthesizing section 11, a clock generating section 12D, an interface section 15, a pre-filtering section 16, and a feedback filtering section 17.

The fifth principle of the frequency synthesizer according to the invention is as follows.

The frequency synthesizing section 11 generate an output signal by performing indirect frequency synthesis in which a phase difference between a reference signal having a reference frequency and the output signal is compressed in synchronization with a clock signal at a period which is equal to a product of a period of the reference signal and a first integer. The interface section 15 transmits a frequency deviation of the reference signal to an apparatus 14 for selecting either the output signal or a standard signal which locally provides a reference of a frequency applied for the indirect frequency synthesis, based on the frequency deviation of the reference signal. The clock generating section 12D generates the clock signal by performing frequency synthesis for the output signal or for the standard signal selected by the apparatus 14 and maintains a frequency of the clock signal at a value which is equal to a difference between or a sum of a first frequency which is equal to a product of the frequency of the reference signal and a second integer and a second frequency indicating a number of times the phase difference is compressed by the frequency synthesizing section 11.

In this frequency synthesizer, the frequency of the clock signal is maintained at a value which is equal to not only the frequency deviation of the reference signal but also the aforementioned difference or sum in a form adapted to the process performed by the apparatus 14.

Accordingly, the frequency synthesizer can be flexibly adapted to devices or systems having various functions, configurations, specifications and so on.

Figure 6:
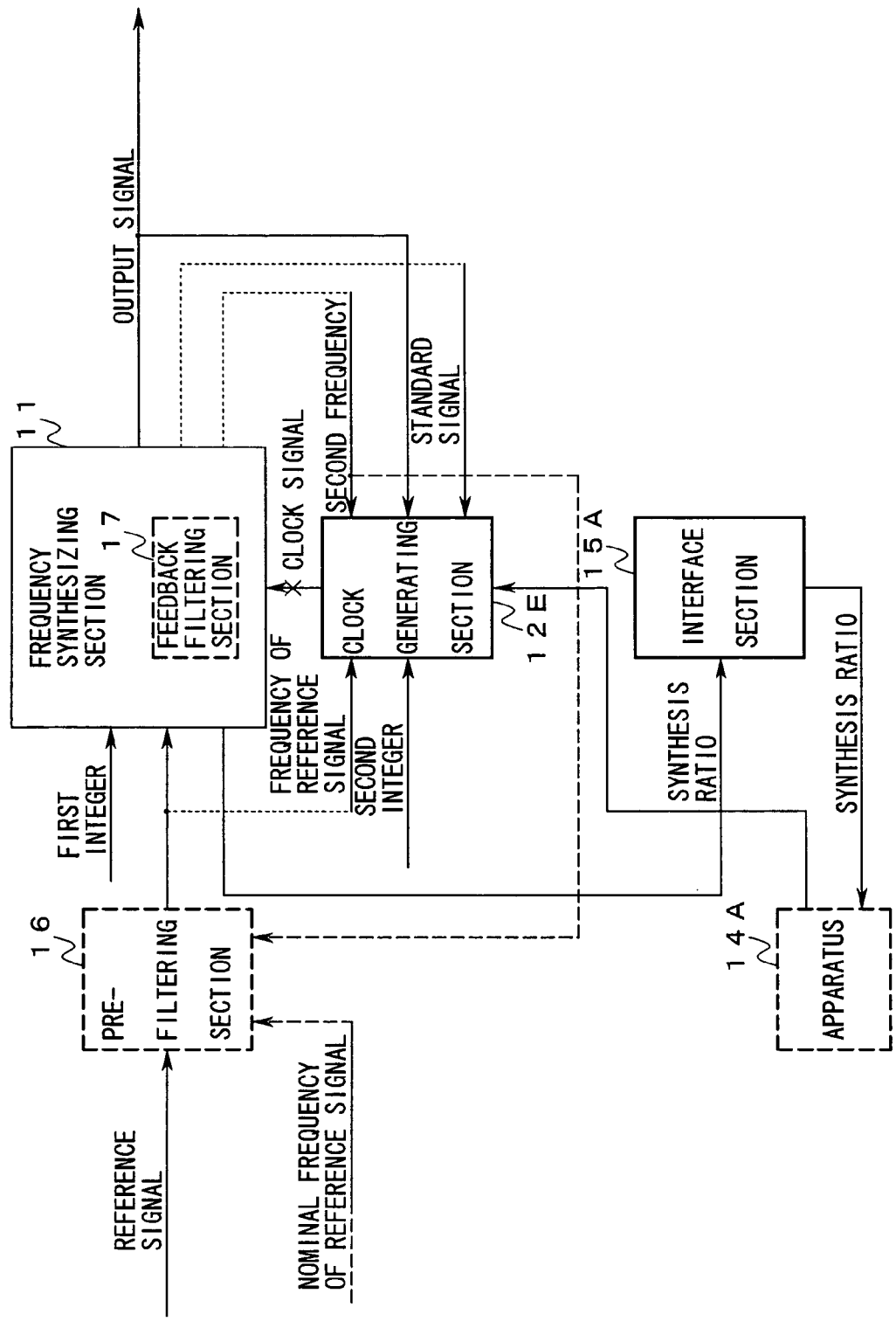
FIG. 6 is a block diagram illustrating a sixth principle of a frequency synthesizer according to the invention.

FIG. 6 is a block diagram illustrating a sixth principle of a frequency synthesizer according to the invention.

The frequency synthesizer shown in FIG. 6 includes a frequency synthesizing section 11, a clock generating section 12E, an interface section 15A, a pre-filtering section 16, and a feedback filtering section 17.

The sixth principle of the frequency synthesizer according to the invention is as follows.

The frequency synthesizing section 11 generate an output signal by performing indirect frequency synthesis in which a phase difference between a reference signal having a reference frequency and the output signal is compressed in synchronization with a clock signal at a period which is equal to a product of a period of the reference signal and a first integer. The interface section 1SA transmits a synthesis ratio of the indirect frequency synthesis performed by the frequency synthesizing section 11 to an apparatus 14A for selecting either the output signal or a standard signal which locally provides a reference of a frequency applied for the indirect frequency synthesis, based on the synthesis ratio. The clock generating section 12E generates the clock signal by performing frequency synthesis for the output signal or for the standard signal selected by the apparatus 14A and maintains a frequency of the clock signal at a value which is equal to a difference between or a sum of a first frequency which is equal to a product of the frequency of the reference signal and a second integer and a second frequency indicating a number of times the phase difference is compressed by the frequency synthesizing section 11.

In this frequency synthesizer, the frequency of the clock signal is maintained at a value which is equal to not only the frequency deviation of the reference signal but also the aforementioned difference or sum in a form adapted to the process performed by the apparatus 14A.

Accordingly, the frequency synthesizer can be flexibly adapted to devices or systems having various functions, configurations, specifications and so on.

A seventh principle of the frequency synthesizer according to the invention is as follows.

The clock generating section 12 and 12A maintain the frequency of the clock signal at a frequency obtained when a frequency not deviated from the frequency of the reference signal is applied as a second frequency.

In this frequency synthesizer, the frequency of the clock signal is maintained at an appropriate value without changing its basic configuration even when the frequency of the reference signal involves deviation, or is varied or shifted.

Accordingly, the frequency of the output signal is maintained at a desired value inexpensively and stably.

An eighth principle of the frequency synthesizer according to the invention is as follows.

The clock generating section 12 and 12A maintain the frequency of the clock signal at a frequency obtained when a frequency not deviated from the frequency of the output signal is applied as a second frequency.

In this frequency synthesizer, the frequency of the clock signal is maintained at an appropriate value without changing its basic configuration even when the frequency of the output signal involves deviation, or is varied or shifted.

Accordingly, phase synchronization of the reference signal is inexpensively and stably maintained in a process of the indirect frequency synthesis performed by the frequency synthesizing section 11.

A ninth principle of the frequency synthesizer according to the invention is as follows.

A pre-filtering section 16 suppresses frequency components, which correspond to both a sum of a nominal frequency of the reference signal and the second frequency and a difference between the nominal frequency of the reference signal and the second frequency or either the sum or the difference of the same, among frequency components of the reference signal, at a previous stage of the frequency synthesizing section 11.

In this frequency synthesizer, an abnormal response of the phase locked loop caused by the fact that lower frequency components or higher frequency components within a range from the frequency fr of the reference signal to the second frequency are included in the reference signal can be avoided.

Accordingly, the frequency of the output signal can be maintained at a desired value precisely and stably.

A tenth principle of the frequency synthesizer according to the invention is as follows.

The feedback filtering section 17 suppresses specific frequency components, which correspond to both a sum of a frequency standard value of the feedback signal whose phase is compared to a phase of the reference signal and the second frequency and a difference between the frequency standard value of the feedback signal and the second frequency or either the sum or the difference of the same, among frequency components of the output signal, in a feedback path for implementing the indirect frequency synthesis.

In this frequency synthesizer, an abnormal response of the phase locked loop caused by the fact that lower frequency components or higher frequency components within a range from the frequency standard value of the feedback signal to the second frequency are included in the feedback signal.

Accordingly, the frequency of the output signal can be maintained at a desired value precisely and stably.

An eleventh principle of the frequency synthesizer according to the invention is as follows.

In a process of converting an output signal into a feedback signal, the feedback filtering section 17 suppresses specific frequency components.

In this frequency synthesizer, frequency components, which are included in the feedback signal and which are lower or higher within a range from the frequency standard value of the feedback signal to the second frequency, are suppressed in a frequency band different from a frequency occupation band of the feedback signal in the feedback path composing the phase locked loop.

Accordingly, a flexible adaptation to the configuration of the feedback path can be made, and an abnormal response of the phase locked loop due to the feedback of the frequency components lower or higher than the frequency standard value of the feedback signal via the feedback path can be reliably avoided.

A twelfth principle of the frequency synthesizer according to the invention is as follows.

The first frequency is a common multiple of a frequency of the reference signal and a nominal frequency of the output signal.

In this frequency synthesizer, since the first frequency corresponds to a multiple of not only the frequency of the reference signal but also a nominal value of the frequency of the output signal to be generated, a phase of the feedback signal, which is compared to a phase of the reference signal in the phase locked loop, can be cyclically obtained as a series of the same phases at a period which is equal to a product of a period of the reference signal and the first integer.

Accordingly, a response of the frequency synthesizer, a distortion ratio of the output signal of the frequency synthesizer and the like are improved and stably maintained, as compared to a case where the first frequency is set to a multiple of only the frequency of the reference signal.

A thirteenth principle of the frequency synthesizer according to the invention is as follows.

The second frequency indicating a number of times the phase difference between the reference signal and the output signal is compressed by the frequency synthesizing section 11 is an integral multiple of the frequency of the reference signal.

In this frequency synthesizer, a phase of the feedback signal, which is compared to a phase of the reference signal in the phase locked loop, can be cyclically obtained as a series of phases at a period which is equal to a product of a period of the reference signal and the first integer.

Accordingly, a response of the frequency synthesizer, a distortion ratio of the output signal of the frequency synthesizer and the like can be improved and stably maintained, as compared to a case where the second frequency does not correspond to an integral multiple of the frequency of the reference signal or has precision or stability lower than that of the frequency of the reference signal.

A fourteenth principle of the frequency synthesizer according to the invention is as follows.

The first integer is set to a large value so that deterioration of precision of indirect frequency synthesis is allowable.

In this frequency synthesizer, the indirect frequency synthesis for generating the output signal is flexibly implemented in various forms even when the frequency of the reference signal is set to a large value.

Accordingly, adaptation to various configurations and characteristics of a frequency synthesizing section 11 and adaptation of the invention to various systems and devices can be made.

A fifteenth principle of the frequency synthesizer according to the invention is as follows.

The second integer is set to a small value so that deterioration of precision of indirect frequency synthesis is allowable.

In this frequency synthesizer, a frequency of the clock signal whose period to be obtained in the phase locked loop is indicated by the phase difference between the reference signal and the feedback signal is set to a desired large value even when a frequency of the reference signal is set to a large value.

Accordingly, the output signal is stably and precisely generated in the indirect frequency synthesis performed using the phase locked loop.

A sixteenth principle of the frequency synthesizer according to the invention is as follows.

The clock generating section 12A to 12E generate the clock signal based on the indirect frequency synthesis for monitoring and correcting a phase deviation as compared to the standard signal or a phase deviation as compared to the standard signal selected by the selection section in a higher frequency band than the second frequency.

In this frequency synthesizer, a division ratio to be applied for frequency divisions of the standard signal and the clock signal in order to compare a phase of the standard signal with a phase of the clock signal in the band of the frequency higher than the second frequency is set to a small value, as compared to a case where the phase comparison is performed in a frequency band including the second frequency.

Accordingly, in the phase locked loop for generating the clock signal using the indirect frequency synthesis, a lock-up is stably implemented and a lock state is stably maintained, as compared to a case where the division ratio is set to a large value.

Hereinafter, embodiments of the invention will be described with reference to the accompanying drawings.

Figure 7:
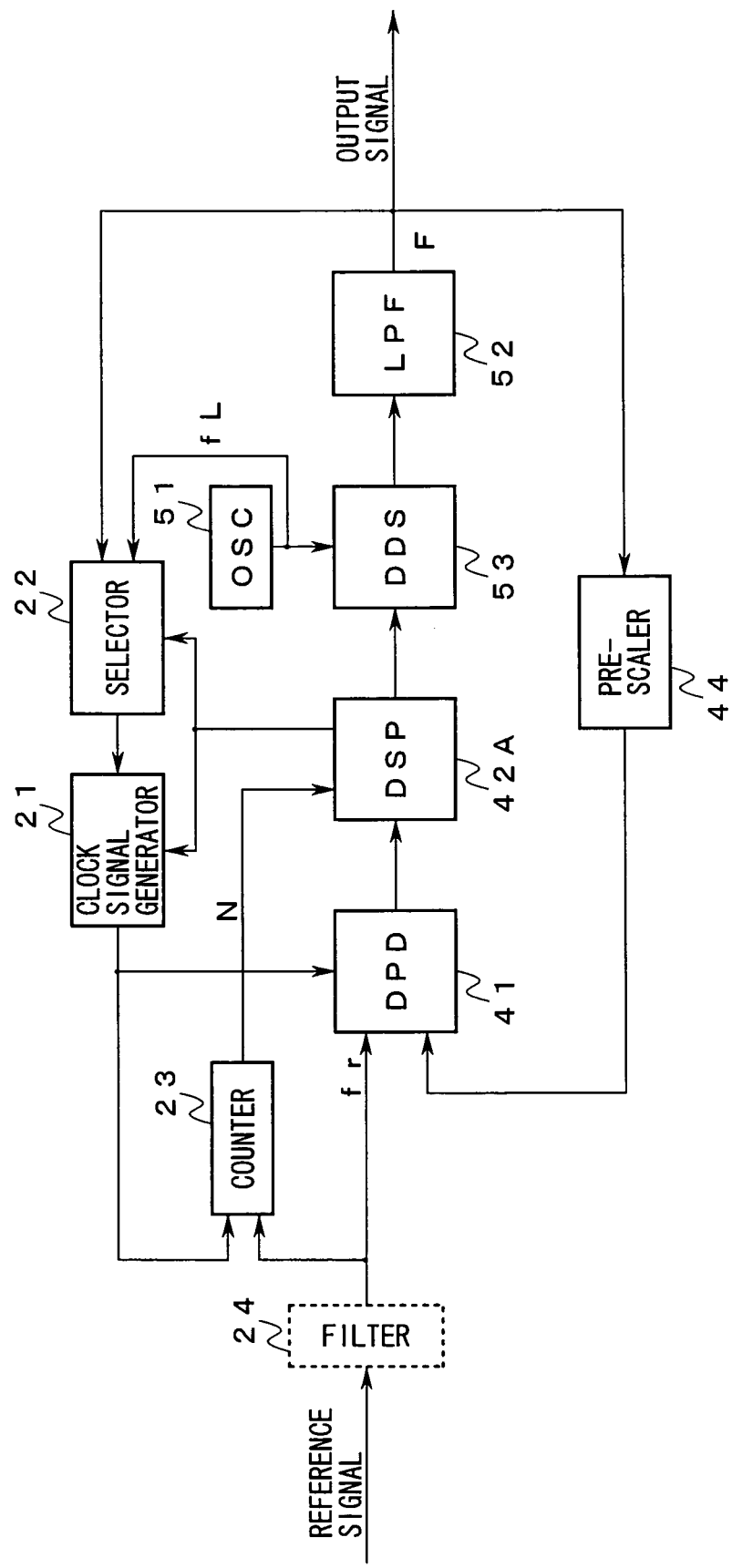
FIG. 7 is a diagram illustrating first to third embodiments of the invention.

FIG. 7 is a diagram illustrating first to third embodiments of the invention.

As shown in the figure, a clock signal generator 21 is provided instead of the clock signal generator 45A as previously described and an output terminal of a selector 22 is connected to an input terminal of the clock signal generator 21. An output terminal of a low pass filter 52 is connected to one input terminal of the selector 22 and an output terminal of a local reference signal oscillator 51 is connected to the other input terminal of the selector 22. The reference signal as previously described is inputted to one input terminal of a counter 23 and an output terminal of the clock signal generator 21 is connected to the other input terminal of the counter 23. A count output terminal of the counter 23 is connected to an input port of a digital signal processor 42A, and an output port of the digital signal processor 42A is connected to a control input terminal of the clock signal generator 21 and a selection input terminal of the selector 22.

First Embodiment

Hereinafter, operation of a first embodiment of the invention will be described with reference to FIG. 7.

The clock signal generator 21 stores two multiplication ratios M0 and M1, as shown by the following equations (1) and (2), for the frequency F (=3.24 MHz) of the output signal as previously described, integration interval $\tau$ (=4 ms=1/250 Hz), and the frequency $f_c$ (=77.76 MHz) of the clock signal and the frequency $f_L$ of the local reference signal in the first and second conventional examples as previously described.

$$M0=[(f_c+1/\tau)/F] \text{ or } [(f_c-1/\tau)/F] \quad (1)$$

$$M1=[(f_c+1/\tau)/f_L] \text{ or } [(f_c-1/\tau)/f_L] \quad (2)$$

In addition, the counter 23 counts a number of times N of detection of a leading edge (or a trailing edge) of the clock signal every period during which a logical value of the reference signal (herein assumed to have a duty ratio of 0.5) is "1" and informs the digital signal processor 42A of the number of times N.

The digital signal processor 42A pre-stores a nominal value of the frequency of the clock signal actually generated by the clock signal generator 21 and a range within which a number of times N for the duty ratio is considered to be proper.

In addition, when a number of times N is given, the digital signal processor 42A performs the following processes.

It is determined whether the number of times N (or an average of the number of times N with one or more number of times previously given) is in the range.

If a result of the determination is yes, a binary signal indicating a logical value of 1 is provided to the selector 22 and the clock signal generator 21.

If a result of the determination is no, a binary signal indicating a logical value of 0 is provided to the selector 22 and the clock signal generator 21.

The selector 22 provides the following signals to the clock signal generator 21 in response to the binary signal of the logical values 0 and 1.

Output signal . . . in a case of the binary signal of the logical value of 1.

Local reference signal . . . in a case of the binary signal of the logical value of 0.

In addition, the clock signal generator 21 generates the clock signal under application of the following multiplication ratios M0 and M1 in response to the binary signal of the logical values 0 and 1.

Multiplication ratio M0 . . . in a case of the binary signal of the logical value of 1.

Multiplication ratio M1 . . . in a case of the binary signal of the logical value of 0.

Accordingly, regardless of the result of the above determination, the frequency of the clock signal generated by the clock signal generator 21 is set to a frequency higher (or lower) by a frequency (hereinafter referred to as an offset frequency), which is equal to a reciprocal number of integration interval τ than the conventional examples, as shown in numerators of the right sides in the above equations (1) and (2).

In other words, a point of time when the phase difference Δθ between the reference signal and the feedback signal is obtained by the digital phase detector 41 is not a point of time when a relative phase for the reference signal is constant, but is cyclically set to a point of time when the relative phase has 32 ($=\tau/fr$) different values for the integration interval τ and the frequency fr of the reference signal, showing one of the following [1], and [2]

$$0, (2\pi \cdot 1/32), (2\pi \cdot 2/32), \ldots, (2\pi \cdot 31/32), 0, \qquad [1]$$

$$0, (2\pi \cdot 31/32), (2\pi \cdot 30/32), \ldots, (2\pi \cdot 1/32), 0, \qquad [2]$$

In this way, according to this embodiment, the phase differences Δθ between the reference signal and the feedback signal, which are obtained as 32 cyclic different phases, are integrated by the digital signal processor 42A. Based on the phase differences Δθ (obtained with a resolution of 0.4 ns ($=1/(77.76 \times 10^6 \times 32)$) for the frequency fc ($=77.76$ MHz) of the clock signal) precisely obtained as a result of the integration, a series of instantaneous values of the control signal to be provided to the direct frequency synthesizer 53 is obtained.

Accordingly, the precision of the frequency of the output signal can be enhanced without significant increase of the frequency of the clock signal, which may suffer from restriction on costs, power consumption, thermal design and other factors.

In addition, according to this embodiment, the counter 23 compares the frequency fr of the reference signal with the frequency of the effective clock signal. If the frequency fr of the reference signal is less than the frequency of the effective clock signal, the output signal is provided to the clock signal generator 21. On the contrary, if the frequency fr of the reference signal exceeds the frequency of the effective clock signal, the local reference signal is provided to the clock signal generator 21.

Accordingly, even when the frequency fr of the reference signal is varied or shifted by a large margin, the resolution of the phase difference Δθ detected by the digital phase detector 41 is maintained at a value less than a value corresponding to the period of the clock signal.

In addition, in this embodiment, the frequency fc ($=77.76$ MHz) is set to a common multiple of the frequency fr ($=8$ KHz) of the reference signal and the frequency F ($=3.24$ MHz) of the output signal.

However, the frequency fc may be set to an integral multiple of only the frequency fr of the reference signal, for example, if deterioration of general performance such as responsivity and distortion ratio of the output signal is allowable.

In addition, in this embodiment, the output signal is generated by the direct frequency synthesizer 53 and the low pass filter 52, which are associated with the local reference oscillator 51, in response to the phase locked loop composed of the pre-scaler 44, the digital phase detector 41 and the digital signal processor 42A.

Figure 10:
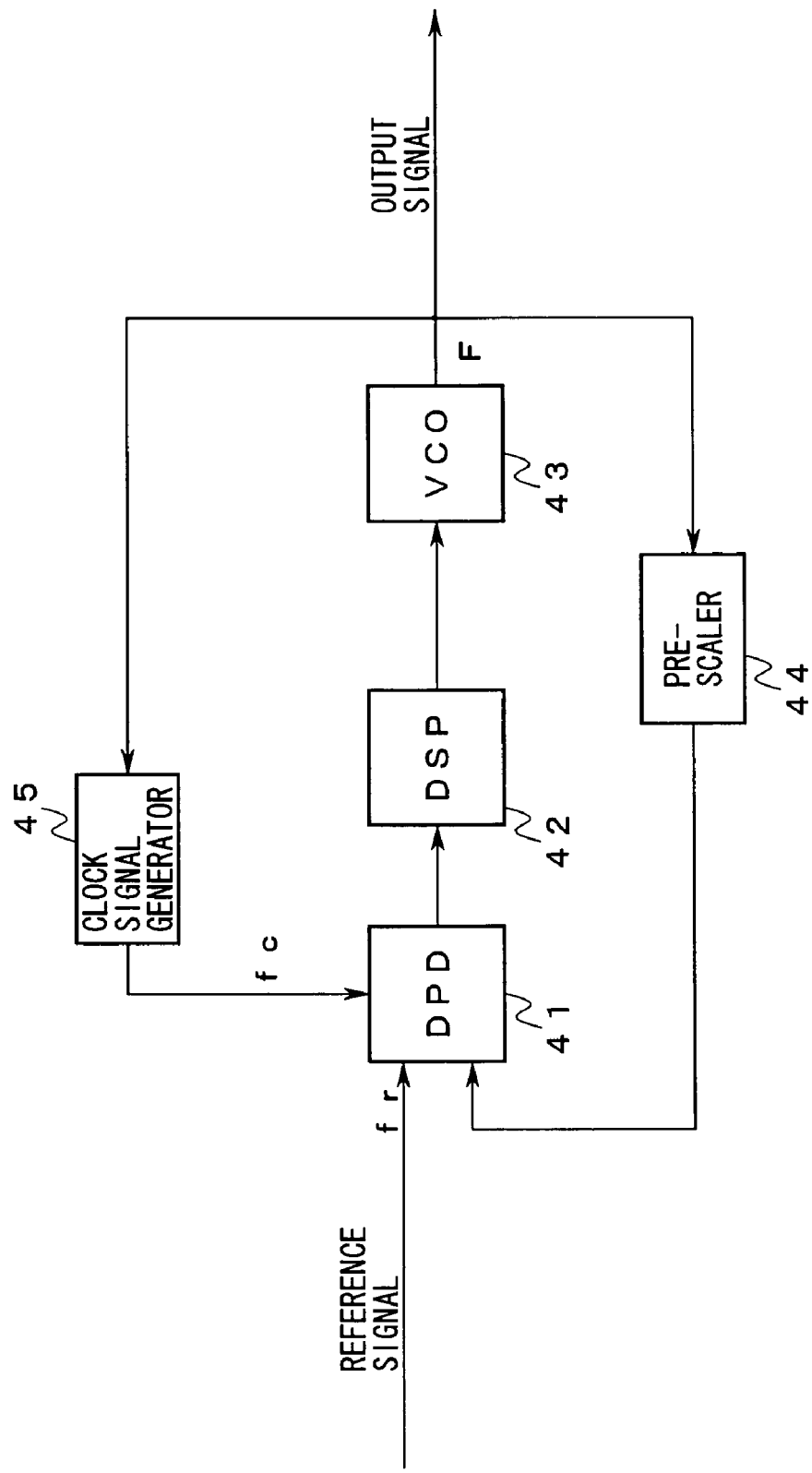
FIG. 10 is a diagram illustrating an example of a first configuration of a conventional frequency synthesizer.
Figure 11:
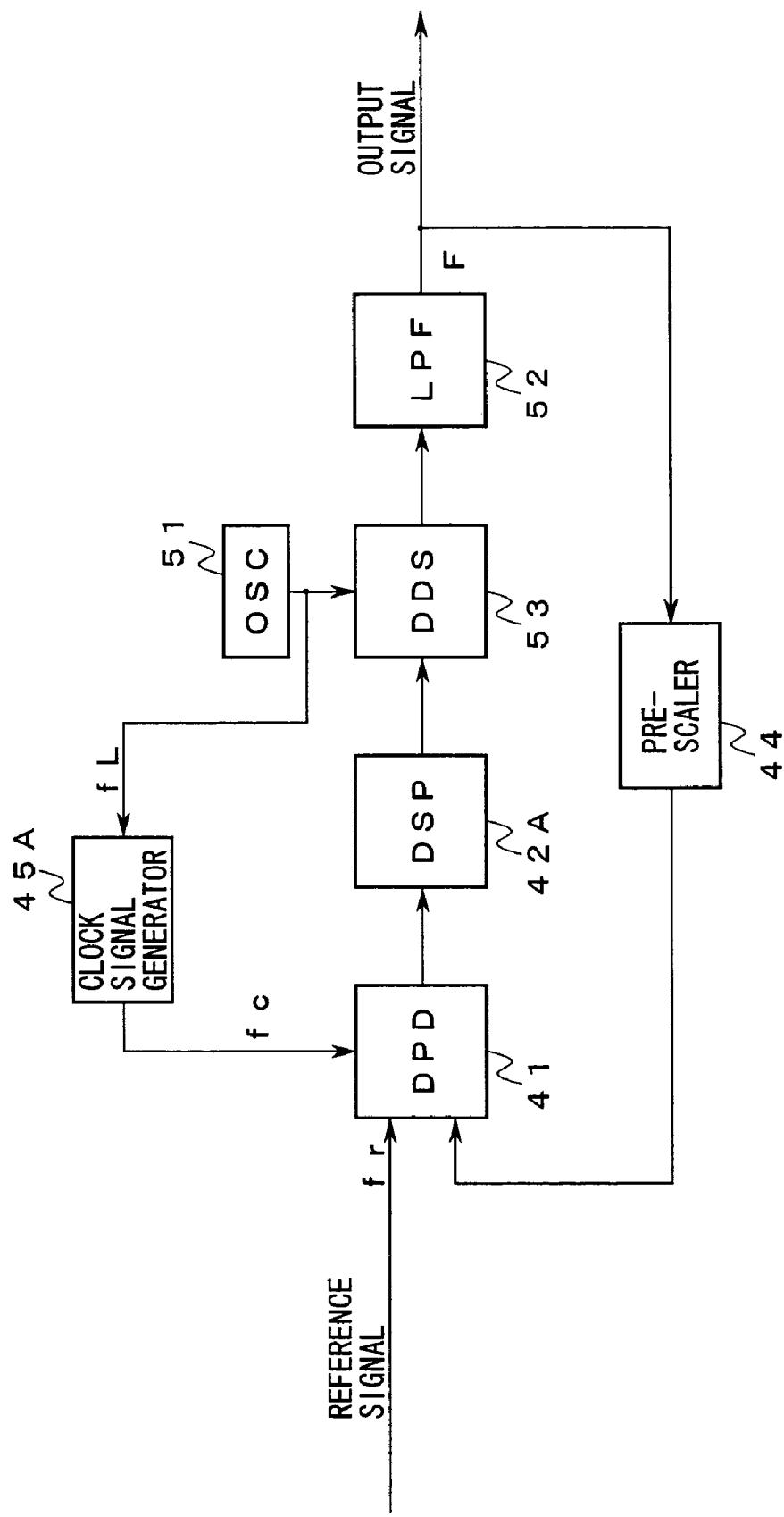
FIG. 11 is a diagram illustrating an example of a second configuration of a conventional frequency synthesizer.

However, the frequency synthesizer of the invention is not limited to this configuration. As shown in FIG. 10, for example, instead of the direct frequency synthesizer 53 and the low pass filter 52, the frequency synthesizer of the invention may include the voltage controlled oscillator 43, which performs a process equivalent to the process performed by the direct frequency synthesizer 53 and the low pass filter 52.

Second Embodiment

Hereinafter, a second embodiment of the invention will be described.

In FIG. 7, the reference signal is provided to the counter 23 and the digital phase detector 41 via a filter 24.

Hereinafter, operation of the second embodiment of the invention will be described with reference to FIG. 7.

The filter 24 has a pass band at the nominal frequency fr of the reference signal and an attenuation band (or attenuation pole) at a frequency, which is equal to both a sum of the nominal frequency fr and the offset frequency (250 Hz) as previously mentioned and a difference between the nominal frequency fr and the offset frequency (250 Hz) or either the sum or the difference of the same.

In addition, when frequency components in the reference signal, which are distributed in the attenuation band (or attenuation pole), are inputted to the digital phase detector 41 without being suppressed (removed) by the filter 24, most of components contained in a signal generated by a modulation product of the frequency components and the clock signal, which is performed in the digital phase detector 41, have direct current components, the frequency components are not nearly removed in a process of low pass filtering performed by the digital signal processor 42A.

Accordingly, according to this embodiment, an abnormal response of the phase locked loop caused by the fact that lower (or higher) frequency components within a range from the frequency fr of the reference signal to the offset frequency are included in the reference signal is avoided, and accordingly, the frequency of the output signal is precisely and stably maintained at a desired value F.

Third Embodiment

Hereinafter, operation of a third embodiment of the invention will be described with reference to FIG. 7.

This embodiment is characterized by the following process performed by the pre-scaler 44 or the digital phase detector 41.

At a final stage of the pre-scaler 44 or an initial stage of the digital phase detector 41 is provided a filter circuit having a pass band at the nominal frequency fr of the reference signal and an attenuation band (or attenuation pole) at a frequency, which is equal to both a sum of the nominal frequency fr and the offset frequency (250 Hz) as previously mentioned and a difference between the nominal frequency fr and the offset frequency (250 Hz) or either the sum or the difference of the same.

In addition, when frequency components contained in the feedback signal generated by the pre-scaler 44, which are distributed in the attenuation band (or attenuation pole), are inputted to the digital phase detector 41 without being suppressed (removed), most of components contained in a signal generated by a modulation product of the frequency components and the reference signal, which is performed in the digital phase detector 41, have direct current components, the frequency components are not nearly removed in a process of low pass filtering performed by the digital signal processor 42A.

Accordingly, according to this embodiment, an abnormal response of the phase locked loop caused by the fact that lower (or higher) frequency components within a range from the nominal frequency of the feedback signal to the offset frequency are included in the feedback signal is avoided, and accordingly, the frequency of the output signal is precisely and stably maintained at a desired value F.

As described above, in this embodiment, the attenuation band (or attenuation pole) is formed by the filter circuit provided at the final stage of the pre-scaler 44 or the initial stage of the digital phase detector 41.

Alternatively, this attenuation band (or attenuation pole) may be formed in a process of signal processing or filtering (including a distributed process performed step by step in different frequency bands) performed when the pre-scaler 44 performs frequency division, for example.

Fourth Embodiment

Figure 8:
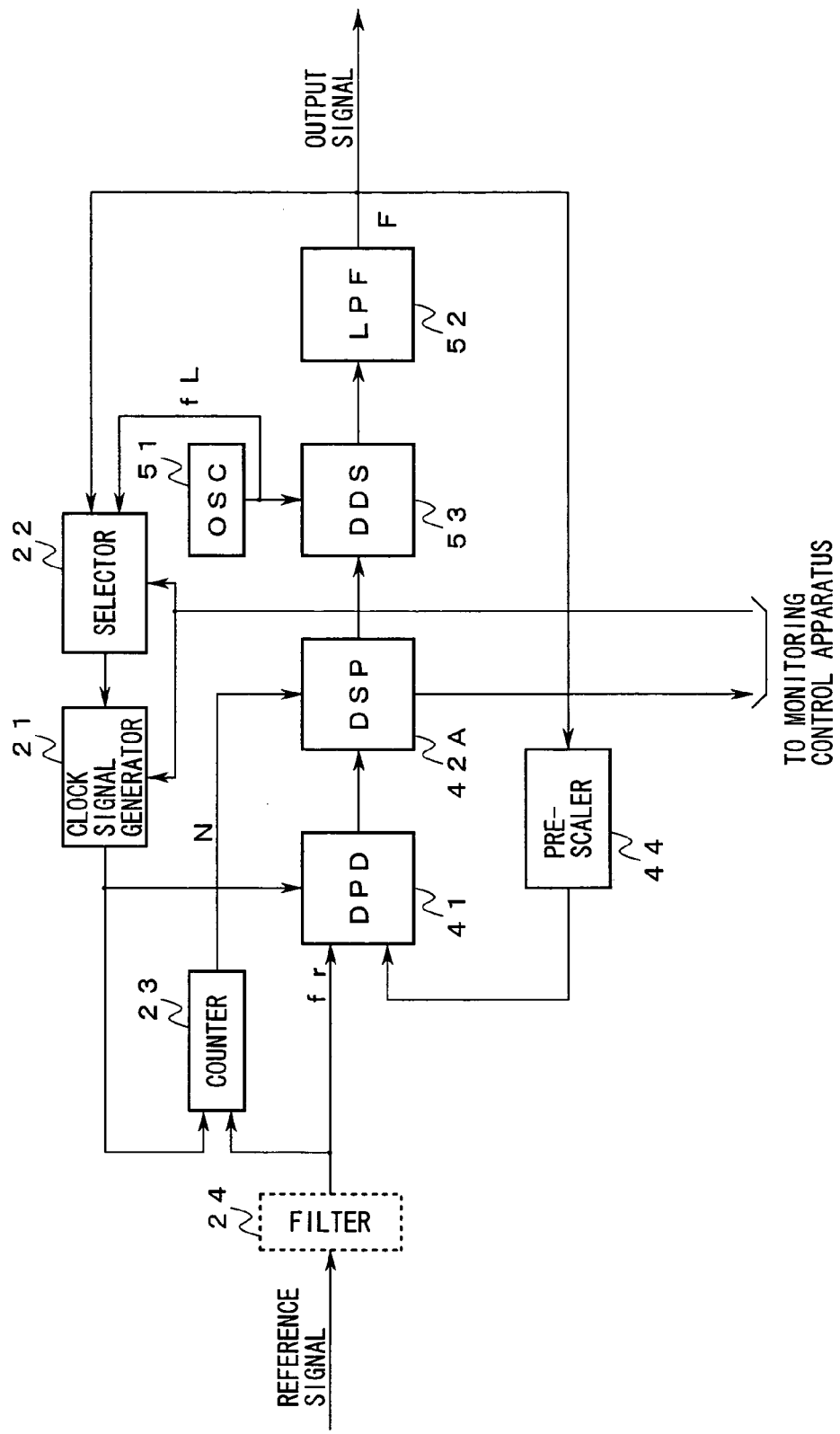
FIG. 8 is a diagram illustrating a fourth embodiment of the invention.

FIG. 8 is a diagram illustrating a fourth embodiment of the invention.

In the figure, an output port of the digital signal processor 42A is connected to a monitoring control apparatus (not shown) without being connected to the control input terminal of the clock signal generator 21 and the selection input terminal of the selector 22, and an output terminal of the monitoring control apparatus is connected to the control input terminal of the clock signal generator 21 and the selection input terminal of the selector 22.

Hereinafter, operation of the fourth embodiment of the invention will be described with reference to FIG. 8.

This embodiment is characterized by the following process performed in cooperation with the digital signal processor 42A and the monitoring control apparatus.

The clock signal generator 21 stores the two multiplication ratios M0 and M1 as in the first embodiment.

In addition, the counter 23 counts a number of times N of detection of a leading edge (or a trailing edge) of the clock signal every period during which a logical value of the reference signal is "1", as in first embodiment.

The digital signal processor 42A informs the monitoring control apparatus of the number of times N (any process may be performed for the number of times N as long as the number N of time is matched to a form of monitoring control, which will be described later).

The monitoring control apparatus pre-stores a nominal value of the frequency of the clock signal actually generated by the clock signal generator 21 and a range within which the number of times N for the duty ratio is considered to be proper, for example.

In addition, the monitoring control apparatus performs the following process for the number of times N, for example, in a form adapted to the form of the monitoring control.

It is determined whether the number of times N (or an average of the number of times N with one or more number of times previously given) is in the range.

If a result of the determination is yes, a binary signal indicating a logical value of 1 is provided to the selector 22 and the clock signal generator 21.

If a result of the determination is no, a binary signal indicating a logical value of 0 is provided to the selector 22 and the clock signal generator 21.

On the other hand, the selector 22 provides the following signals to the clock signal generator 21 in response to the binary signal of the logical values 0 and 1.

Output signal . . . in a case of the binary signal of the logical value of 1.

Local reference signal . . . in a case of the binary signal of the logical value of 0.

In addition, the clock signal generator 21 generates the clock signal under application of the following multiplication ratios M0 and M1 in response to the binary signal of the logical values 0 and 1.

Multiplication ratio M0 . . . in a case of the binary signal of the logical value of 1.

Multiplication ratio M1 . . . in a case of the binary signal of the logical value of 0.

Accordingly, regardless of the result of the above determination, under control of the monitoring control apparatus for performing the monitoring control, the frequency of the clock signal generated by the clock signal generator 21 is set to a frequency higher (or lower) by the offset frequency, which is equal to a reciprocal number of integration interval $\tau$ than the conventional examples, as shown in numerators of the right sides in the above equations (1) and (2).

Fifth Embodiment

Figure 9:
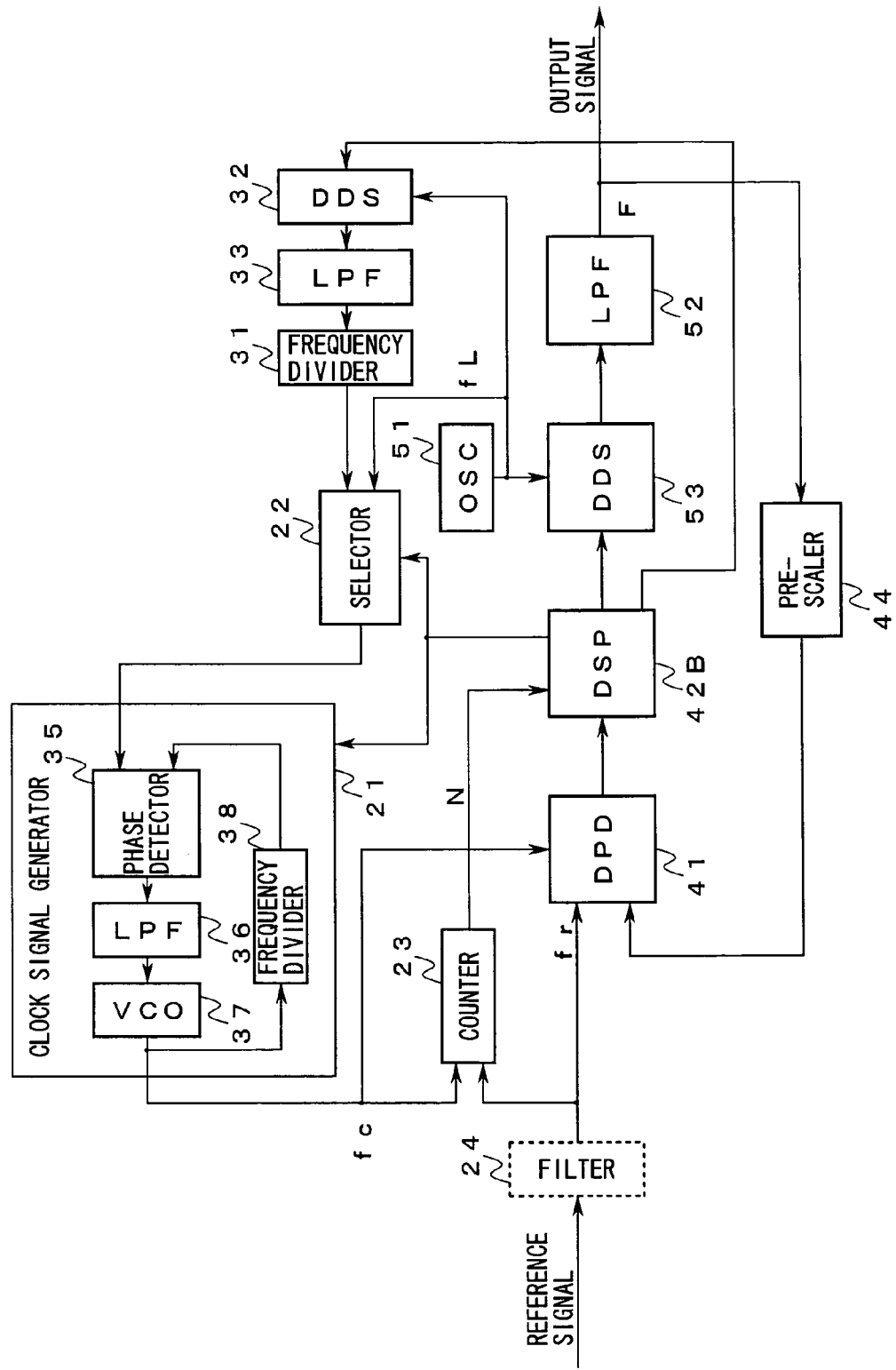
FIG. 9 is a diagram illustrating a fifth embodiment of the invention.

FIG. 9 is a diagram illustrating a fifth embodiment of the invention.

This embodiment is configured as follows.
(1) An output terminal of a frequency divider 31 instead of the output terminal of the low pass filter 52 is connected to the one input terminal of the selector 22.
(2) A digital signal processor 42B is provided instead of the digital signal processor 42A.
(3) A specific output port of the digital signal processor 42B is connected to an input terminal of the frequency divider 31 via the direct frequency synthesizer (DDS) 32 and the low pass filter (LPF) 33, which are cascaded.
(4) The clock signal generator 21 is configured as a phase locked oscillator composed of the following components.
A digital phase detector 35 having one input terminal connected to the output terminal of the selector 22
A low pass filter (LPF) 36 connected in series to an output terminal of the digital phase detector 35
A voltage controlled oscillator (VCO) 37 connected in series to an output terminal of the low pass filter 36 and arranged as a final stage of the clock signal generator 21
A frequency divider 38 connected in series to an output terminal of the voltage controlled oscillator 37 and having an output terminal connected to the other input terminal of the digital phase detector 35

Hereinafter, operation of the fifth embodiment of the invention will be described with reference to FIG. 9.

This embodiment is characterized by the following respects.

A frequency of a signal generated in cooperation with the direct frequency synthesizer 32, the low pass filter 33, and the frequency divider 31 under the control of the digital signal processor 42B and provided to the clock signal generator 21 via the selector 22

A frequency division ratio set in the frequency divider 31 and the frequency divider 38 provided in the clock signal generator 21

While updating (including initially setting) of the instantaneous value $V_c$ of the control signal provided to the direct frequency synthesizer 53, the digital signal processor 42B provides one of the following subcontrol signals defined precisely in accordance to a characteristic of the direct frequency synthesizer 32 to the direct frequency synthesizer 32.

A control signal with an instantaneous value vc ($=V_c+\alpha$), which is equal to a sum of the instantaneous value $V_c$ and a correction value $\alpha$ indicating conditions that a frequency of a signal generated by the direct frequency synthesizer 32 is set to a sum of a target frequency value (nominal value) F (=3.24 MHz) of the output signal and a frequency $\delta$, which is equal to 1/24 of the offset frequency (=250 HZ) (hereinafter, this control signal is referred to as subcontrol signal)

A control signal with an instantaneous value vc at which an estimation value of a frequency of a signal generated by the direct frequency synthesizer 32 is equal to a sum of a target frequency value (nominal value) F (=3.24 MHz) of the output signal and a frequency $\delta$, which is equal to 1/24 of the offset frequency (=250 HZ) (hereinafter, this control signal is referred to as subcontrol signal)

By performing direct frequency synthesis by a synthesis ratio indicated by the instantaneous value vc of the subcontrol signal for the local reference signal generated by the local reference signal oscillator 51, the direct frequency synthesizer 32 generates a signal with a frequency of about 3.2400104 MHz (=3.24 MHz+(250/24) Hz).

The low pass filter 33 generates a pseudo output signal by removing spurious noise and other unnecessary frequency components contained in the signal. The frequency divider 31 divides a frequency of the pseudo output signal with the division ratio of 1.

The frequency divider 38 included in the clock signal generator 21 generates the feedback signal with the frequency of about 3.2400104 MHz (=3.24 MHz+(250/24) Hz) by dividing, with the division ratio of 24, the clock signal generated by the voltage controlled oscillator 37 and having the nominal frequency fc higher by 250 Hz than 77.76 MHz. The digital phase detector 35 outputs a control voltage, which indicates a phase difference between the feedback signal and the pseudo output signal outputted from the frequency divider 31 as an instantaneous value. The low pass filter 36 removes noise components included in the control voltage. The voltage controlled oscillator 37 maintains the frequency fc of the clock signal at the nominal value (=77.76025 MHz) by varying an oscillation frequency in response to the control voltage provided through the low pass filter 36.

In other words, in this embodiment, although the clock signal is generated by the phase locked oscillator (synthesizer performing the indirect frequency synthesis) in response to the pseudo output signal, which is generated without following the feedback path of the circuit for generating the output signal or by the direct frequency synthesizer 32 and the low pass filter 33 provided independent of the feedback path and has a frequency, which is precisely equal to F+$\delta$, the division ratios of the frequency dividers 38 and 31 arranged in the feedback path of the phase locked oscillator and at a previous stage of the phase locked oscillator, respectively, are set to small values of 24 and 1, respectively, even when one of the frequency F of the output signal and the frequency fc of the clock signal is set to a large value or the offset frequency is set to a small value.

On the other hand, the division ratios of the frequency dividers 38 and 31 are set to large values of 12960 (=3.24× $10^6$/250) and 311.041 (=(77.76×$10^6$+250)/250) by a large margin, respectively, when the output signal instead of the pseudo output signal is inputted to the direct frequency synthesizer 32 and the following conditions are satisfied, for example.

The frequency F of the output signal is 3.24 MHz.

The offset frequency is 250 Hz.

The frequency fc of the clock signal is 77.76025 MHz.

Accordingly, in this embodiment, these division ratios are set to large values, and accordingly, the following problems occurring when frequencies of the feedback signal inputted to the digital phase detector 35 and a signal providing a basis of phase deviation of the feedback signal are set to a small value, for example, the offset frequency, are reliably avoided.

A cut-off frequency of the phase locked loop provided in the clock signal generator 21 has a small value.

A stable lock-up of the phase lock loop and maintenance of a lock state are obstructed due to such a small cut-off frequency.

Due to these problems, there are restrictions on selection of the offset frequency, the division ratios of the frequency dividers 38 and 31, and the configuration (including frequency synthesis methods) of the clock signal generator 21. Also, there are restrictions on security and maintenance of performance and reliability of the frequency synthesizer as well as security of a degree of freedom related to design, adjustment and repair of the frequency synthesizer and inexpensiveness of the frequency synthesizer.

In addition, this embodiment is implemented by adding the direct frequency synthesizer 32, the low pass filter 33 and the frequency divider 31, which may also be provided for the conventional examples and the first to fourth embodiments, and making a slight correction for software (firmware) to be executed by the digital signal processor 42 and 42A.

In other words, since the security of performance and the reduction of production costs are realized without doing any damage to the standardization of the components of the frequency synthesizer, equipments or systems including the frequency synthesizer according to this embodiment have a good cost to performance ratio and high reliability.

Incidentally, in this embodiment, the precision of the frequency of the pseudo output signal generated by the direct frequency synthesizer 32 is not described in detail.

However, for example, when a bit value of the direct frequency synthesizer 32 is 32 and a nominal frequency of a signal to be generated by the direct frequency synthesizer 32 is 17 MHz, this precision becomes 3.958 mHz (=17 MHz/$2^{32}$).

Also, under such a precision, the frequency of the pseudo output signal, which is inputted to the clock signal generator 21 (digital phase detector 35) and has a nominal value of (3.24 MHz+10.4166666 Hz) is set to (3.24 MHz+10.4177743 Hz), and the frequency fc of the clock signal is set to 77.76025003 MHZ and a value sufficient to achieve the previously described operation and effects with sufficient precision.

In addition, in this embodiment, the direct frequency synthesizer 32 may generate the pseudo output signal or a signal to be used to generate the pseudo output signal independently, without operating under control of the digital signal processor 42B.

In addition, in this embodiment, the reference signal instead of the local reference signal may be inputted to the direct frequency synthesizer 32.

In addition, in this embodiment, the division ratios of the division divider 38 and 31 may be set to any value as long as the frequency of the feedback signal has a value larger than the offset frequency, the frequency F of the output signal is stably generated with desired precision, and the aforementioned problems are surely avoided.

In addition, in this embodiment, the direct frequency synthesizer 32, the low pass filter 33 and the frequency divider 31 are arranged at a previous stage of the selector 22, and the clock signal is generated in cooperation of the direct frequency synthesizer 32, the low pass filter 33 and the frequency divider 31 with the clock signal generator 21.

However, the invention is not limited to this configuration. For example, when the clock signal having a desired frequency fc is generated by a single phase locked oscillator in synchronization with the local reference signal, the direct frequency synthesizer 32 and the low pass filter 33 may be omitted.

In addition, in this embodiment, by properly setting the division ratios of the frequency dividers 38 and 31, the frequency of the feedback signal inputted to the digital phase detector 35 is set to a frequency higher than the offset frequency.

However, the invention is not limited to this configuration. For example, as long as the frequency of the feedback signal is set to a proper value, a frequency conversion circuit and other frequency synthesis circuits may be provided instead of the frequency dividers 38 and 31.

In addition, in all embodiments as described above, the logical value of the binary signal is obtained as a result of a determination on whether or not a number of times N indicating a ratio of the deviation of the frequency fr of the reference signal to the deviation of the frequency of the clock signal is in the predefined range.

However, for example, the logical value of the binary signal may be obtained as a result of a determination on whether or not the phase difference $\Delta\theta$ (or an integration value of the phase difference $\Delta\theta$) obtained by the digital phase detector 41 is in the predefined range.

In addition, in all embodiments as described above, the frequency of the clock signal is set to a value, which is equal to $(f_c \pm 1/\tau)$ for the integration interval $\tau$, as shown in the numerator of the right sides of the above equations (1) and (2).

However, the invention is not limited to this configuration. For example, as long as desired performance and precision are achieved without deteriorating the effects achieved by all embodiments as described above, the frequency of the clock signal may be set to a value, which is equal to $(f_c \pm i/\tau)$ for two or more integers i, so that the following respects may be attained.

Flexible selection of the frequency $f_c$ of the reference signal

Flexible adaptation to the precision of the digital phase detector 41, responsivity or throughput of the digital signal processors 42 and 42A, characteristics of the direct frequency synthesizer 53 and so on.

In addition, in all embodiments as described above, the integration interval $\tau$ is set to 32 times the frequency (=1/fr) of the reference signal.

However, as long as desired performance and precision are achieved without deteriorating the effects achieved by all embodiments as described above, this integration interval $\tau$ may be set to a value, which is equal to a product of an integer less than 32 and the frequency (=1/fr) of the reference signal, for example.

In addition, in all embodiments as described above, as long as the aforementioned effects can be achieved with desired precision and reliability, the frequencies of the reference signal, the output signal, the clock signal and the feedback signal may be set at any value.

In addition, in all embodiments as described above, the frequency multiplication is performed by the clock signal generator 21 and the frequency division is performed by the pre-scaler 44.

However, the invention is not limited to this configuration. For example, as long as the output signal having a desired frequency F in response to the frequency fr of the reference signal is generated according to the indirect frequency synthesis, the process performed by the clock signal generator 21 and the pre-scaler 44 may include any combination (including frequency synthesis or frequency conversion) of all or some of multiplication, division, mixing, and filtering.

In addition, in all embodiments as described above, the clock signal is generated according to the frequency synthesis (multiplication) performed for the output signal or the local reference signal by the clock signal generator 21.

However, the invention is not limited to this configuration. For example, all or some of the aforementioned frequency synthesis (multiplication) processes may be performed by both or one of a hardware contained in the selector 22 and a hardware arranged or added at a previous stage of the selector 22.

In addition, in all embodiments as described above, most of the processes performed in respective components of the frequency synthesizer are performed in the digital domain.

However, the invention is not limited to this configuration. All or some of these processes are substantially equivalent to the processes described in the embodiments of the invention and may be performed in the analog domain as long as desired precision or responsivity is secured.

In addition, in all embodiments as described above, the aforementioned two multiplication ratios M0 and M1 are predefined in the clock signal generator 21.

However, the invention is not limited to this configuration. For example, the multiplication ratios may be properly predefined in the digital signal processor 42A or the aforementioned monitoring control apparatus.

The invention is not limited to the above embodiments and various modifications may be made without departing from the spirit and scope of the invention. Any improvement may be made in part or all of the components.

What is claimed is:

1. A frequency synthesizer comprising:
a frequency synthesizing section generating an output signal by performing indirect frequency synthesis in which a phase difference between a reference signal having a reference frequency and the output signal is compressed in synchronization with a clock signal at a period which is equal to a product of a period of the reference signal and a first integer; and
a clock generating section generating the clock signal by performing frequency synthesis for the output signal, and maintaining a frequency of the clock signal at a value which is equal to a difference between or a sum of a first frequency which is equal to a product of the frequency of the reference signal and a second integer and a second frequency indicating a number of times the phase difference is compressed by the frequency synthesizing section.

2. A frequency synthesizer comprising:
a frequency synthesizing section generating an output signal by performing indirect frequency synthesis in which a phase difference between a reference signal having a reference frequency and the output signal is compressed in synchronization with a clock signal at a period which is equal to a product of a period of the reference signal and a first integer; and
a clock generating section generating the clock signal by performing frequency synthesis for a standard signal which locally provides a reference of a frequency applied for the indirect frequency synthesis, and maintaining a frequency of the clock signal at a value which is equal to a difference between or a sum of a first frequency which is equal to a product of the frequency of the reference signal and a second integer and a second frequency indicating a number of times the phase difference is compressed by the frequency synthesizing mean.

3. A frequency synthesizer comprising:
a frequency synthesizing section generating an output signal by performing indirect frequency synthesis in which a phase difference between a reference signal having a reference frequency and the output signal is compressed in synchronization with a clock signal at a period which is equal to a product of a period of the reference signal and a first integer;
a selection section comparing a frequency deviation of the reference signal with a threshold value which is less than a second frequency indicating a number of times the phase difference between the reference signal and the output signal is compressed, selecting the output signal when the frequency deviation of the reference signal is less than the threshold value, and selecting a standard signal which locally provides a reference of a frequency applied for the indirect frequency synthesis when the frequency deviation of the reference signal exceeds the threshold value; and
a clock generating section generating the clock signal by performing frequency synthesis for the output signal or for the standard signal selected by the selection section and, maintaining a frequency of the clock signal at a value which is equal to a difference between or a sum of a first frequency which is equal to a product of the frequency of the reference signal and a second integer and a second frequency indicating a number of times the phase difference is compressed by the frequency synthesizing section.

4. The frequency synthesizer according to claim 1, wherein
the clock generating section maintains the frequency of the clock signal at a frequency obtained when a frequency not deviated from the frequency of the reference signal is applied as a second frequency.

5. The frequency synthesizer according to claim 2, wherein
the clock generating section maintains the frequency of the clock signal at a frequency obtained when a frequency not deviated from the frequency of the reference signal is applied as a second frequency.

6. The frequency synthesizer according to claim 1, wherein
the clock generating section maintains the frequency of the clock signal at a frequency obtained when a frequency not deviated from the frequency of the output signal is applied as a second frequency.

7. The frequency synthesizer according to claim 2, wherein
the clock generating section maintains the frequency of the clock signal at a frequency obtained when a frequency not deviated from the frequency of the output signal is applied as a second frequency.

8. The frequency synthesizer according to claim 1, further comprising:
a pre-filtering section suppressing frequency components among frequency components of the reference signal at a previous stage of the frequency synthesizing section, the frequency components corresponding to one or both of a sum and a difference of a nominal frequency of the reference signal and the second frequency.

9. The frequency synthesizer according to claim 2, further comprising:
a pre-filtering section suppressing frequency components among frequency components of the reference signal at a previous stage of the frequency synthesizing section, the frequency components corresponding to one or both of a sum and a difference of a nominal frequency of the reference signal and the second frequency.

10. The frequency synthesizer according to claim 1, wherein
the frequency synthesizing section includes:
a feedback filtering section suppressing specific frequency components among frequency components of the output signal in a feedback path for implementing the indirect frequency synthesis, the specific frequency components corresponding to one or both of a sum and a difference of a frequency standard value of a feedback signal and the second frequency, the feedback signal being compared in phase with the reference signal.

11. The frequency synthesizer according to claim 2, wherein
the frequency synthesizing section includes:
a feedback filtering section suppressing specific frequency components among frequency components of the output signal in a feedback path for implementing the indirect frequency synthesis, the specific frequency components corresponding to one or both of a sum and a difference of a frequency standard value of a feedback signal and the second frequency, the feedback signal being compared with the reference signal in phase.

12. The frequency synthesizer according to claim 1, wherein
the first frequency is a common multiple of a frequency of the reference signal and a nominal frequency of the output signal.

13. The frequency synthesizer according to claim 2, wherein
the first frequency is a common multiple of a frequency of the reference signal and a nominal frequency of the output signal.

14. The frequency synthesizer according to claim 1, wherein
the second frequency indicates a number of times the phase difference is compressed by the frequency synthesizing section is an integral multiple of the frequency of the reference signal.

15. The frequency synthesizer according to claim 2, wherein
the second frequency indicates a number of times the phase difference is compressed by the frequency synthesizing section is an integral multiple of the frequency of the reference signal.

16. The frequency synthesizer according to claim 1, wherein
the first integer is set to a large value so that deterioration of precision of the indirect frequency synthesis is allowable.

17. The frequency synthesizer according to claim 2, wherein
the first integer is set to a large value so that deterioration of precision of the indirect frequency synthesis is allowable.

18. The frequency synthesizer according to claim 1, wherein
the second integer is set to a small value so that deterioration of precision of the indirect frequency synthesis is allowable.

19. The frequency synthesizer according to claim 2, wherein
the second integer is set to a small value so that deterioration of precision of the indirect frequency synthesis is allowable.

* * * * *